(12) United States Patent
Hsieh

(10) Patent No.: US 12,248,168 B2
(45) Date of Patent: Mar. 11, 2025

(54) ELECTRONIC DEVICE

(71) Applicant: InnoLux Corporation, Miao-Li County (TW)

(72) Inventor: Hung-Ming Hsieh, Miao-Li County (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 18/653,154

(22) Filed: May 2, 2024

(65) Prior Publication Data

US 2024/0402415 A1 Dec. 5, 2024

(30) Foreign Application Priority Data

Jun. 2, 2023 (CN) .......................... 202310646114.2

(51) Int. Cl.
*F21V 8/00* (2006.01)
*H10K 59/80* (2023.01)

(52) U.S. Cl.
CPC ......... *G02B 6/0081* (2013.01); *H10K 59/871* (2023.02)

(58) Field of Classification Search
CPC ............................ G02B 6/0081; H10K 59/871
See application file for complete search history.

(56) References Cited

U.S. PATENT DOCUMENTS

2015/0085471 A1* 3/2015 Jeon .................. G02B 6/005
362/97.2

FOREIGN PATENT DOCUMENTS

CN 113971904 A 1/2022

* cited by examiner

*Primary Examiner* — Donald L Raleigh
(74) *Attorney, Agent, or Firm* — MUNCY, GEISSLER, OLDS & LOWE, P.C.

(57) ABSTRACT

An electronic device includes a back plate, a filling member, an adhesive layer and a panel. The back plate includes a bottom surface, at least two side walls, at least two extension portions and at least one corner. The filling member is disposed at the corner of the back plate. The adhesive layer is disposed on the filling member. The panel is disposed on the adhesive layer. There is a first distance between the bottom surface and one of the at least two extension portions, and a maximum distance between the bottom surface and the filling member is a second distance, where the second distance is greater than the first distance.

20 Claims, 7 Drawing Sheets

ELECTRONIC DEVICE

CROSS-REFERENCE TO RELATED APPLICATIONS

This application claims the benefits of the Chinese Patent Application Serial Number 202310646114.2, filed on Jun. 2, 2023, the subject matter of which is incorporated herein by reference.

BACKGROUND

Field of the Disclosure

The present disclosure relates to an electronic device and, more particularly, to an electronic device with a filling member.

Description of Related Art

With the advancement of science and technology, display technology is also continuously improving. At the same time, in order to meet consumers' requirements for the display quality of electronic devices, manufacturers are all committed to improving the display quality of electronic devices.

However, the current electronic devices still encounter problems in display quality, such as light leakage or poor taste. Therefore, there is a need to provide an electronic device that can mitigate and/or obviate the above defects so as to enhance display quality.

SUMMARY

The present disclosure provides an electronic device, which includes: a back plate including a bottom surface, at least two side walls, at least two extension portions and at least one corner, wherein one of the at least two side walls is connected to the bottom surface and one of the at least two extension portions, part of the bottom surface and the at least two extension portions are parallel to each other, and the at least one corner is disposed between two adjacent extension portions; a filling member disposed at the corner of the back plate; an adhesive layer disposed on the filling member; and a panel disposed on the adhesive layer, wherein there is a first distance between the bottom surface and one of the at least two extension portions, a maximum distance between the bottom surface and the filling member is a second distance, and the second distance is greater than the first distance.

Other novel features of the disclosure will become more apparent from the following detailed description when taken in conjunction with the accompanying drawings.

DETAILED DESCRIPTION OF EMBODIMENT

Figure 1A:
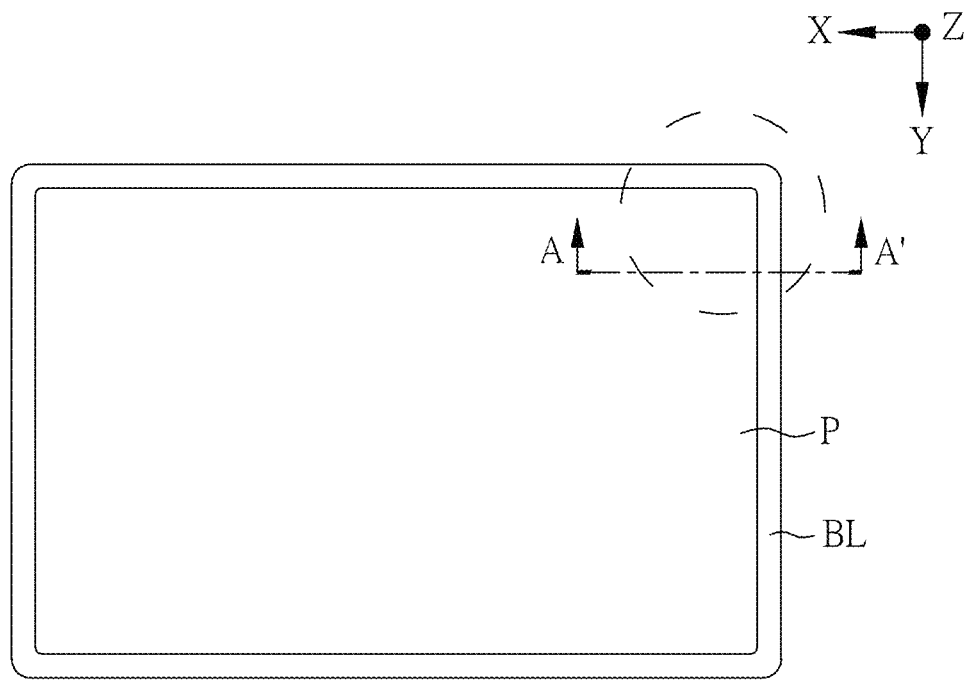
FIG. 1A is a schematic top view of the electronic device according to an embodiment of the present disclosure.

The following provides different embodiments of the present disclosure. These embodiments are used to illustrate the technical content of the present disclosure, rather than to limit the claims of the present disclosure. A feature of one embodiment can be applied to other embodiments through suitable modification, substitution, combination, and separation.

It should be noted that, in the specification and claims, unless otherwise specified, having "one" element is not limited to having a single said element, but one or more said elements may be provided. In addition, in the specification and claims, unless otherwise specified, ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. A "first" element and a "second" element may appear together in the same component, or separately in different components. The existence of an element with a larger ordinal number does not necessarily mean the existence of another element with a smaller ordinal number.

Throughout the specification and the appended claims, certain terms may be used to refer to specific components. Those skilled in the art will understand that electronic device manufacturers may refer to the same components by different names. The present disclosure does not intend to distinguish between components that have the same function but have different names. In the following description and claims, words such as "comprising", "containing" and "having" are open-ended words, and should be interpreted as meaning "including but not limited to". Accordingly, when the terms "comprising", "containing" and/or "having" are used in the description of the present disclosure, they specify the presence of the corresponding features, regions, steps, operations and/or components, but do not exclude the presence of one or more corresponding features, regions, steps, operations and/or components.

In the description, the terms "almost", "about", "approximately" or "substantially" usually means within 10%, 5%, 3%, 2%, 1% or 0.5% of a given value or range. The quantity given here is an approximate quantity; that is, without specifying "almost", "about", "approximately" or "substantially", it can still imply the meaning of "almost", "about", "approximately" or "substantially". In addition, the term "range of the first value to the second value" or "range between the first value and the second value" indicates that the range includes the first value, the second value, and other values in between.

Unless otherwise defined, all terms (including technical and scientific terms) used herein have the same meaning as commonly understood by those skilled in the art related to the present disclosure. It can be understood that these terms, such as those defined in commonly used dictionaries, should be interpreted as having meaning consistent with the relevant technology and the background or context of the present disclosure, and should not be interpreted in an idealized or excessively formal way. Unless there is a special definition in the embodiment of the present disclosure.

In addition, relative terms such as "below" or "bottom", and "above" or "top" may be used in the embodiments to describe the relationship between one component and another component in the drawing. It can be understood that, if the device in the drawing is turned upside down, the components described on the "lower" side will become the components on the "upper" side. When the corresponding member (such as a film or region) is described as "on another member", it may be directly on the other member, or there may be other members between the two members. On the other hand, when a member is described as "directly on another member", there is no member between the two members. In addition, when a member is described as "on another member", the two members have a vertical relationship in the top view direction, and this member may be above or below the other member, while the vertical relationship depends on the orientation of the device.

In the present disclosure, the height and distance may be measured using an optical microscope, and the height and distance may be obtained by measuring a cross-sectional image in an electron microscope, but the present disclosure is not limited thereto. In addition, there may be certain errors between any two values or directions used for comparison. If the first value is equal to the second value, it implies that there may be an error of about 10% between the first value and the second value. If the first direction is perpendicular to the second direction, the angle between the first direction and the second direction may be 80 to 100 degrees. If the first direction is parallel to the second direction, the angle between the first direction and the second direction may be 0 to 10 degrees.

It should be noted that the technical solutions provided by the different embodiments described hereinafter may be used interchangeably, combined or mixed to form another embodiment without violating the spirit of the present disclosure.

Figure 1B:
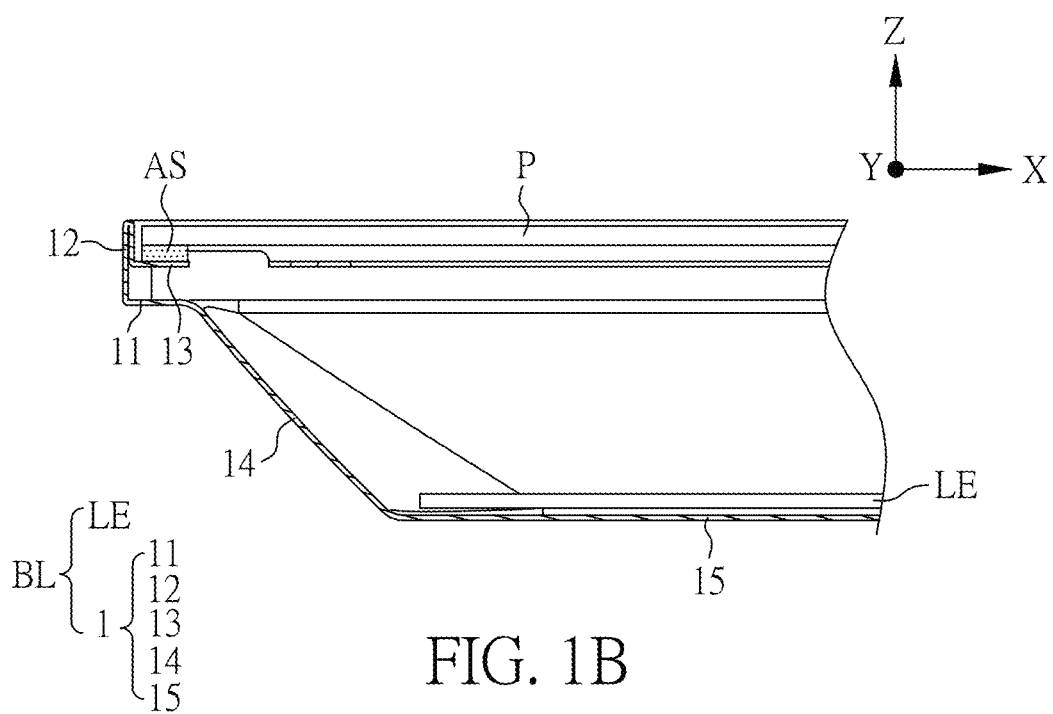
FIG. 1B is a schematic cross-sectional view of the electronic device of FIG. 1A taken along line A-A'.

FIG. 1A is a schematic top view of the electronic device according to an embodiment of the present disclosure, and FIG. 1B is a schematic cross-sectional view of the electronic device of FIG. 1A taken along line A-A'.

In one embodiment of the present disclosure, as shown in FIG. 1A and FIG. 1B, the electronic device may include: a backlight module BL; a panel P disposed opposite to the backlight module BL; and an adhesive layer AS, wherein the panel P is disposed on the adhesive layer AS and is arranged on the backlight module BL through the adhesive layer AS.

In one embodiment of the present disclosure, as shown in FIG. 1B, the backlight module BL may include a back plate 1; and a light emitting unit LE disposed on the back plate 1. The back plate 1 may include a bottom surface 11, a side wall 12, an extension portion 13, an inclined surface 14 and a flat surface 15, wherein the side wall 12 is connected to the bottom surface 11 and the extension portion 13, part of the bottom surface 11 and the extension portion 13 are parallel to each other, the inclined surface 14 is connected to the bottom surface 11 and the flat surface 15, and the light emitting unit LE may be disposed on the flat surface 15.

In the present disclosure, although not shown in the figure, the panel P may include a TFT substrate, a color filter substrate, a cover substrate, a touch layer, a display medium layer, a polarizer, and other suitable components, or a combination thereof. Therefore, the panel P may be a display panel, such as a flexible display panel, a touch display panel, a curved display panel or a tiled display panel, but the present disclosure is not limited thereto. Therefore, the electronic device of the present disclosure may be an electronic device that needs to display images, such as a monitor, a mobile phone, a laptop computer, a video camera, a camera, a music player, a mobile navigation device, a television set, or a tiled TV wall, but the present disclosure is not limited thereto. In the present disclosure, the material of the adhesive layer AS may include glass glue, silicone glue, tape, hot melt glue, AB glue, two-component adhesive, polymer glue, optical clear adhesive (OCA), optical clear resin (OCR), polyvinyl butyral (PVB), ethylene vinyl acetate (EVA), thermoplastic polyurethane (TPU), other suitable materials or a combination thereof, but the present disclosure is not limited thereto. In the present disclosure, the light emitting unit LE may include a light emitting diode, and the light emitting diode may be, for example, an organic light emitting diode (OLED), a mini light emitting diode (mini LED), a micro light emitting diode (micro LED) or a quantum dot light emitting diode (quantum dot LED, which may be QLED, QDLED), fluorescence, phosphor or other suitable materials, or a combination thereof, but the present disclosure is not limited thereto.

Figure 2A:
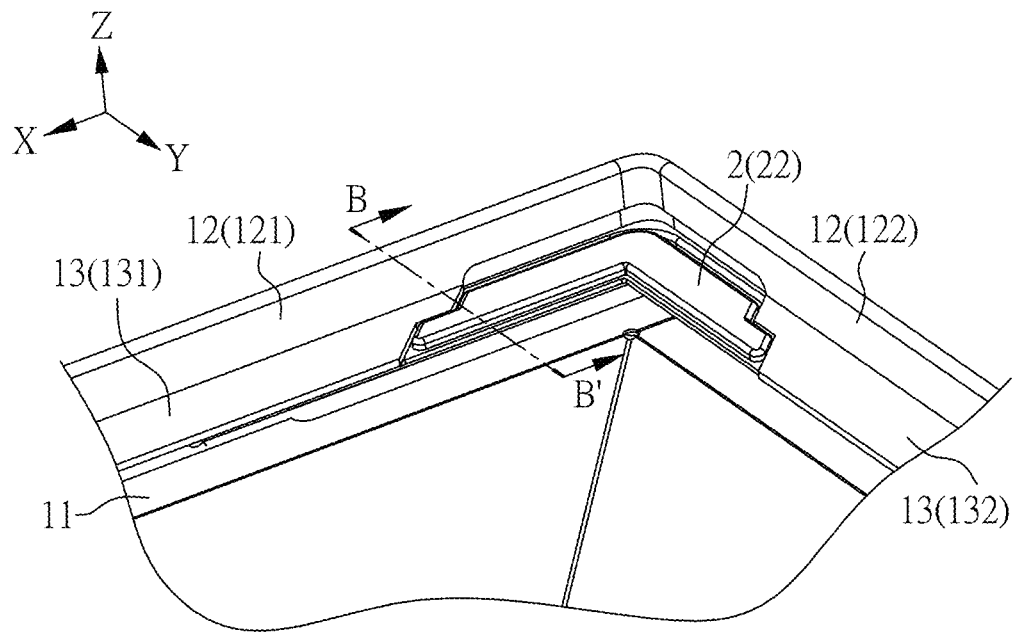
FIG. 2A is an enlarged three-dimensional schematic diagram of the portion circled in FIG. 1A.
Figure 2B:
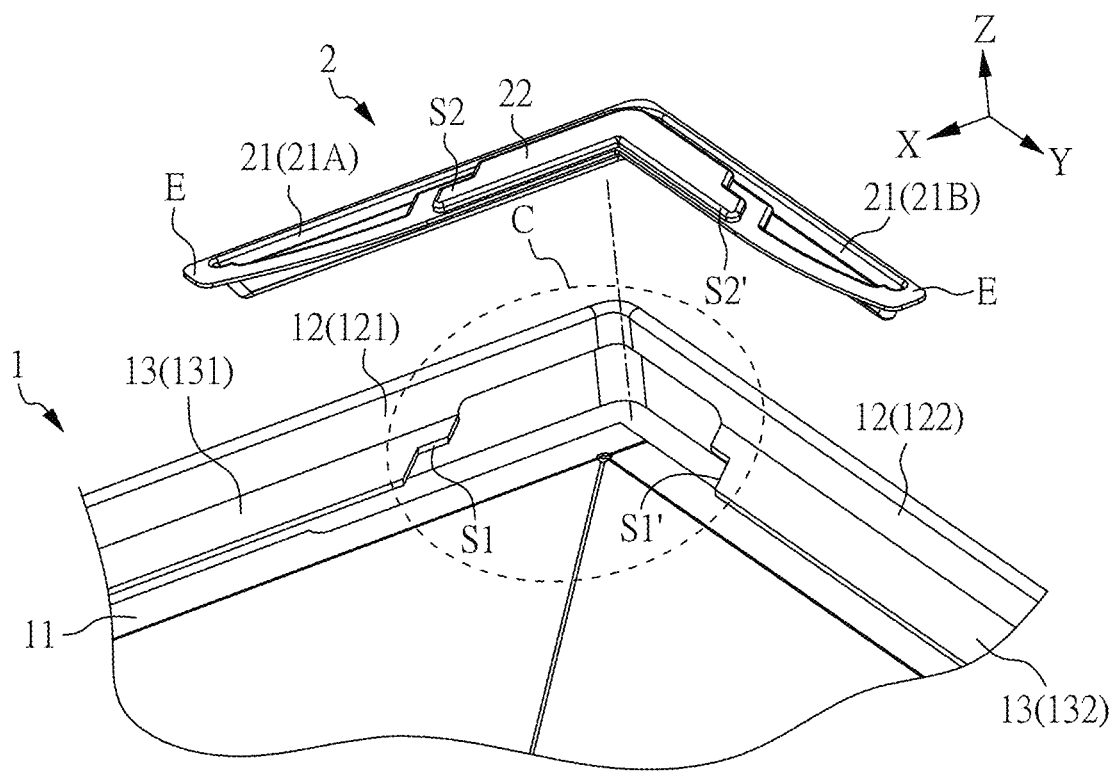
FIG. 2B is an exploded view of the electronic device of FIG. 2A.
Figure 2C:
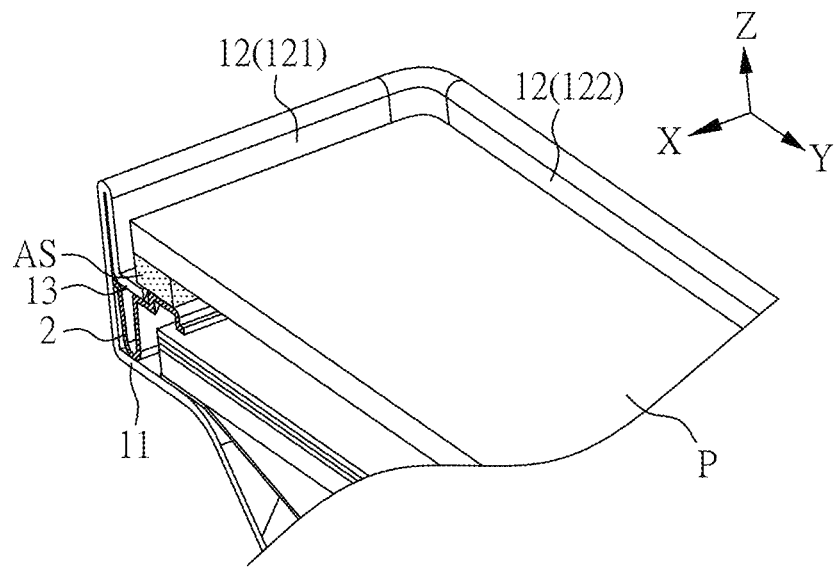
FIG. 2C is a schematic three-dimensional cross-sectional view of the electronic device of FIG. 2A taken along line B-B'.
Figure 2D:
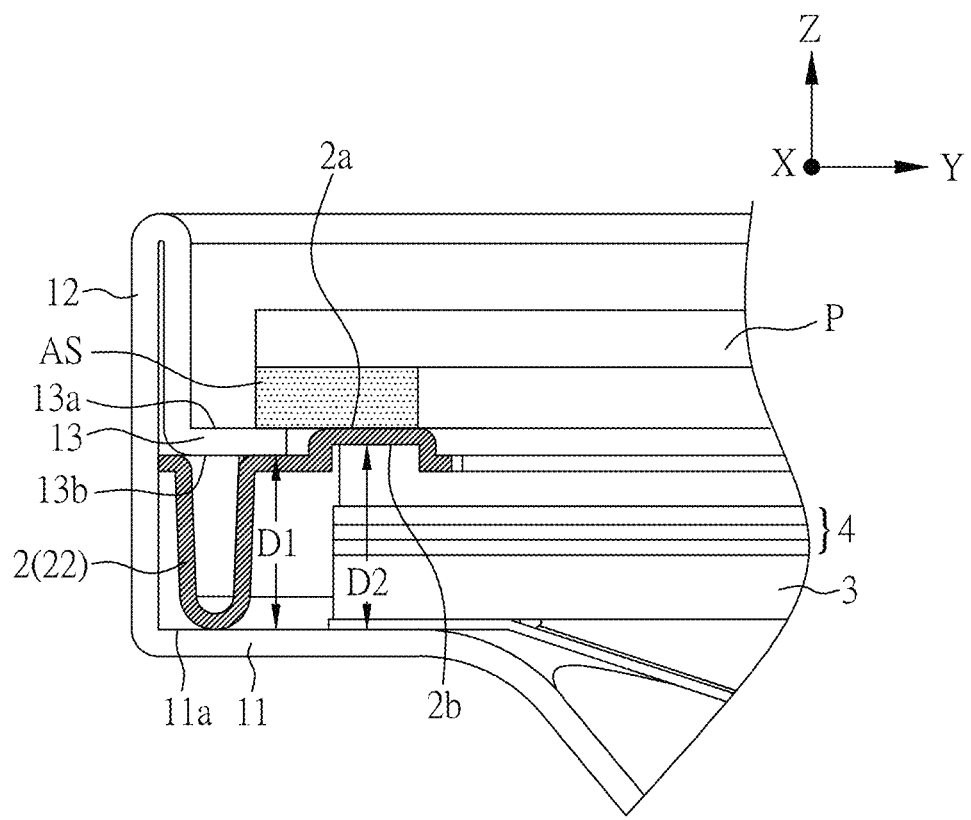
FIG. 2D is a schematic cross-sectional view of the electronic device of FIG. 2A taken along line B-B'.

FIG. 2A is an enlarged three-dimensional schematic diagram of the portion circled in FIG. 1A, FIG. 2B is an exploded view of the electronic device of FIG. 2A, FIG. 2C is a schematic three-dimensional cross-sectional view of the electronic device of FIG. 2A taken along line B-B', and FIG. 2D is a schematic cross-sectional view of the electronic device of FIG. 2A taken along line B-B', wherein, for convenience of explanation, some components are omitted in FIG. 2A and FIG. 2B.

In one embodiment of the present disclosure, as shown in FIGS. 2A to 2D, the backlight module BL (shown in FIG. 1B) may include: a back plate 1. The back plate 1 includes a bottom surface 11 and at least two side walls 12, at least two extension portions 13 and at least one corner C, wherein one of the at least two side walls 12 is connected to the bottom surface 11 and one of the at least two extension portions 13, part of the bottom surface 11 and the at least two extension portions 13 are parallel to each other, and the at least one corner C is disposed between two adjacent extension portions 13; and a filling member 2 disposed at the corner C of the back plate 1. The adhesive layer AS may be disposed on the filling member 2 and the at least two extension portions 13. With the arrangement of the filling member 2, it is able to mitigate the defects of light leakage for the electronic device of the present disclosure.

More specifically, in the present disclosure, as shown in FIGS. 2A and 2B, the back plate 1 may include at least two side walls 12, such as a first side wall 121 and a second side wall 122, wherein the first side wall 121 extends along a first direction X, the second side wall 122 extends along a second direction Y, the first side wall 121 and the second side wall 122 are respectively connected to the bottom surface 11, and the first side wall 121 and the second side wall 122 are connected at the corner C. In one embodiment of the present disclosure, the first direction X and the second direction Y are respectively perpendicular to the normal direction Z of the panel P (as shown in FIG. 2C and FIG. 2D), and the first direction X is substantially perpendicular to the second direction Y, so that the included angle between the first side wall 121 and the second side wall 122 is substantially equal to 90 degrees. In the present disclosure, the back plate 1 may include at least two extension portions 13, such as a first extension portion 131 and a second extension portion 132, wherein the first extension portion 131 extends along the first direction X and is connected to the first side wall 121, the second extension portion 132 extends along the second direction Y and is connected to the second side wall 122, and the corner C is disposed between the first extension portion 131 and the second extension portion 132.

In the present disclosure, as shown in FIG. 2D, there is a first distance D1 between the bottom surface 11 and one of the at least two extension portions 13, the maximum distance between the bottom surface 11 and the filling member 2 is a second distance D2, and the distance D2 is greater than the first distance D1. When the first distance D1 and the second distance D2 satisfy the above relationship, the backlight module BL (as shown in FIG. 1B) may be provided with an excellent light-shielding effect. In the present disclosure, the "first distance" refers to, for example, the maximum distance between the upper surface 11a of the bottom surface 11, which is parallel to the extension portion 13, and the lower surface 13b of the extension portion 13 in the normal direction Z of the panel P. The "second distance" refers to, for example, the maximum distance between the upper surface 11a of the bottom surface 11, which is parallel to the extension portion 13, and the lower surface 2b of the filling member 2 in the normal direction Z of the panel P. Alternatively, in the present disclosure, the "first distance" refers to, for example, the maximum vertical distance between the upper surface 11a of the bottom surface 11 and the lower surface 13b of the extension portion 13 in a cross-sectional view (as shown in FIG. 2D), and the "second distance" refers to, for example, the maximum vertical distance between the upper surface 11a of the bottom surface 11, which is parallel to the extension portion 13, and the lower surface 2b of the filling member 2 in a cross-sectional view (as shown in FIG. 2D).

In addition, in the present disclosure, as shown in FIG. 2D, in the normal direction Z of the panel P, the maximum distance between the upper surface 11a of the bottom surface 11 and the upper surface 13a of the extension portion 13 may be substantially equal to the maximum distance between the upper surface 11a of the bottom surface 11 and the upper surface 2a of the filling member 2. As a result, the adhesive layer AS may flatly extend to be arranged on the extension portion 13 and the filling member 2 for adhering to the panel P above it.

In the present disclosure, the material of the back plate 1 may include metal, plastic, ceramics, other suitable materials, or a combination thereof, but the present disclosure is not limited thereto. In the present disclosure, the material of the filling member 2 may include polyvinyl chloride (PVC), polyethylene terephthalate (PET), polypropylene (PP), polystyrene (PS), polymethylmethacrylate (PMMA), ABS (acrylonitrile butadiene styrene) resin, other suitable materials or a combination thereof, but the present disclosure is not limited thereto. In addition, the filling member 2 may be produced through blister molding, hot press molding or other suitable processes, so as to reduce costs. In one embodiment of the present disclosure, the filling member 2 is prepared through a blister molding process.

In one embodiment of the present disclosure, as shown in FIG. 2D, the electronic device may include: a diffusion plate 3 disposed on the back plate 1; and an optical film set 4 disposed on the diffusion plate 3. The diffusion plate 3 and the optical film set 4 may be used to uniformly introduce the light source of the light emitting unit LE (shown in FIG. 1B) into the panel P so as to improve the display quality. In the present disclosure, the diffusion plate 3 may be a single-layer or multi-layer structure, and the material of the diffusion plate 3 may include polycarbonate (PC), polyimide (PI), polyethylene terephthalate (PET), polymer polyol (POP), polymethylmethacrylate (PMMA), cycloolefin polymer (COP), rubber, glass, other suitable materials or a combination thereof, but the present disclosure is not limited thereto. In the present disclosure, the optical film set 4 may be a single-layer or multi-layer optical film, for example, it may include brightness-enhancing films, glossy films, other optical films or a combination thereof, but the present disclosure is not limited thereto.

Figure 3A:
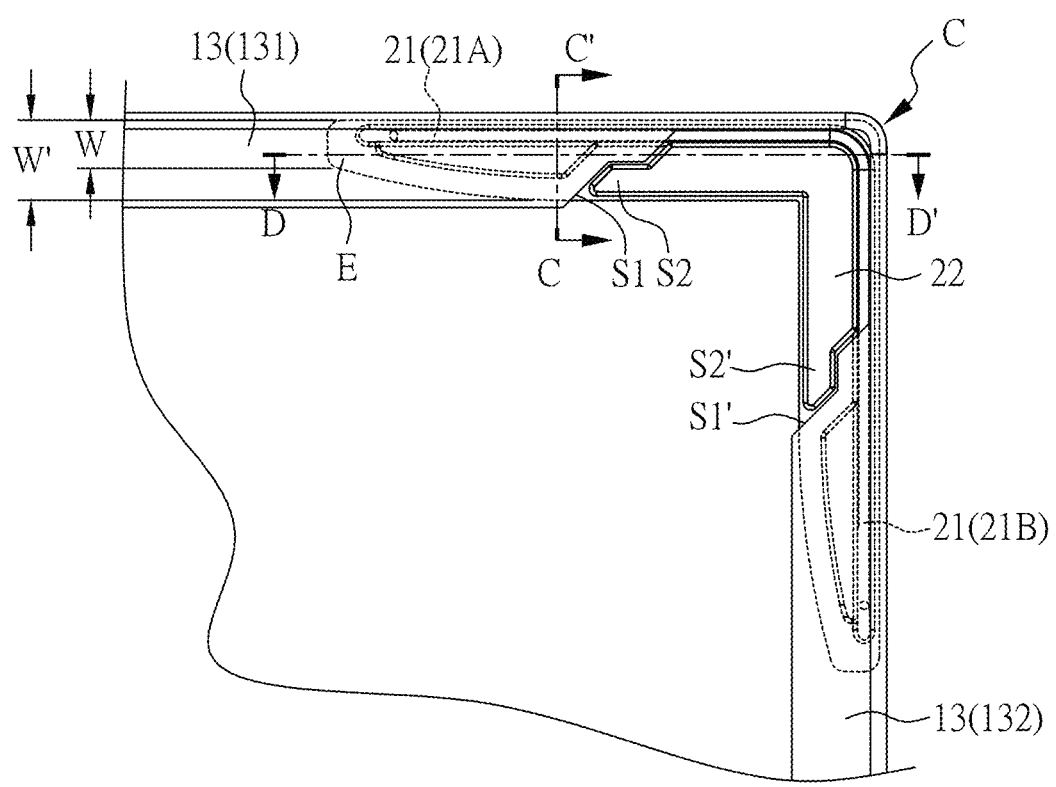
FIG. 3A is an enlarged schematic diagram of the portion circled in FIG. 1A.
Figure 3B:
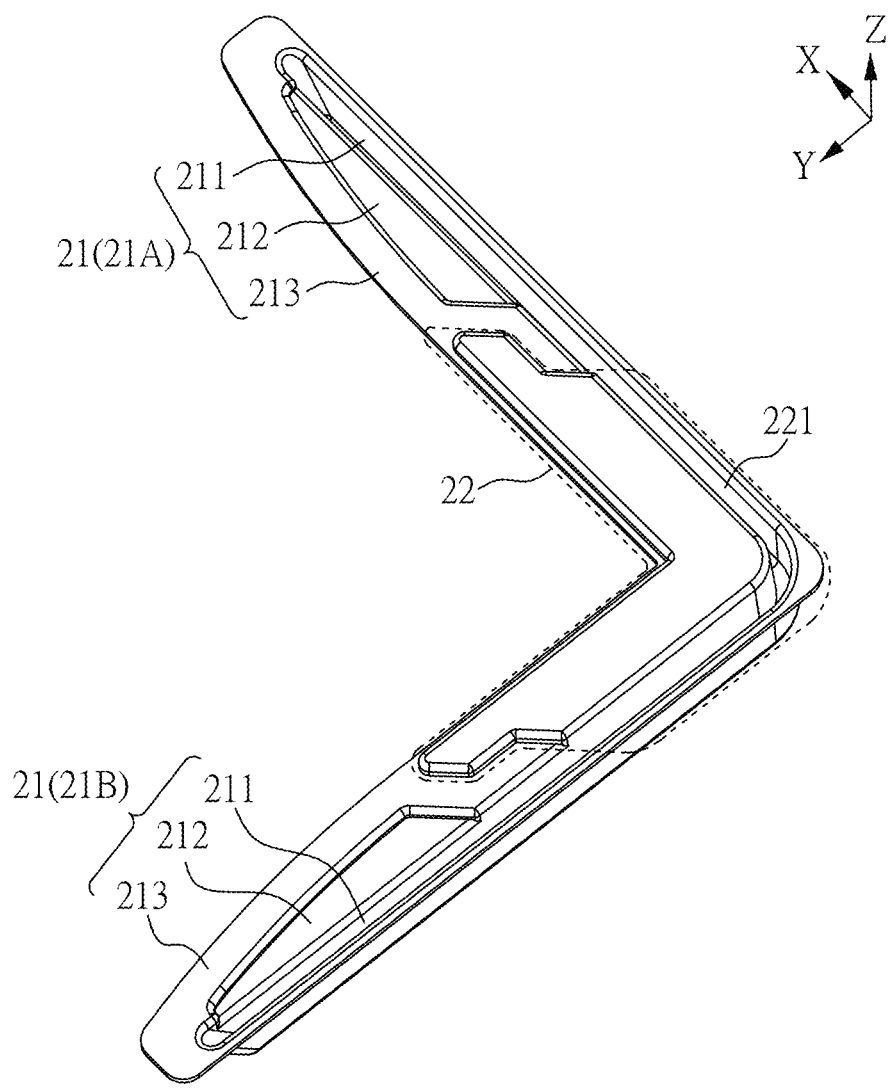
FIG. 3B is a schematic three-dimensional view of a filling member according to an embodiment of the present disclosure.
Figure 3C:
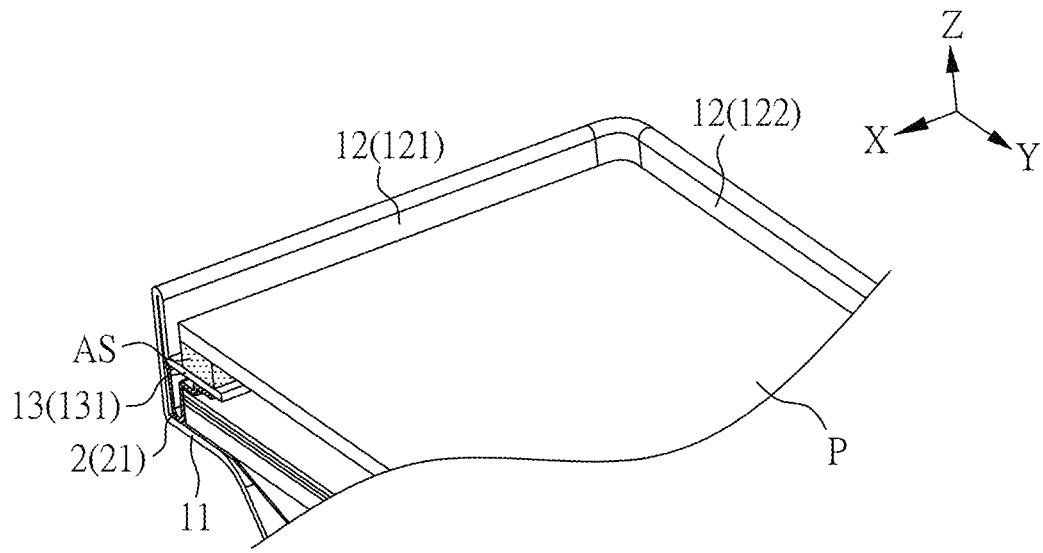
FIG. 3C is a schematic three-dimensional cross-sectional view of the electronic device of FIG. 3A taken along line C-C'.
Figure 3D:
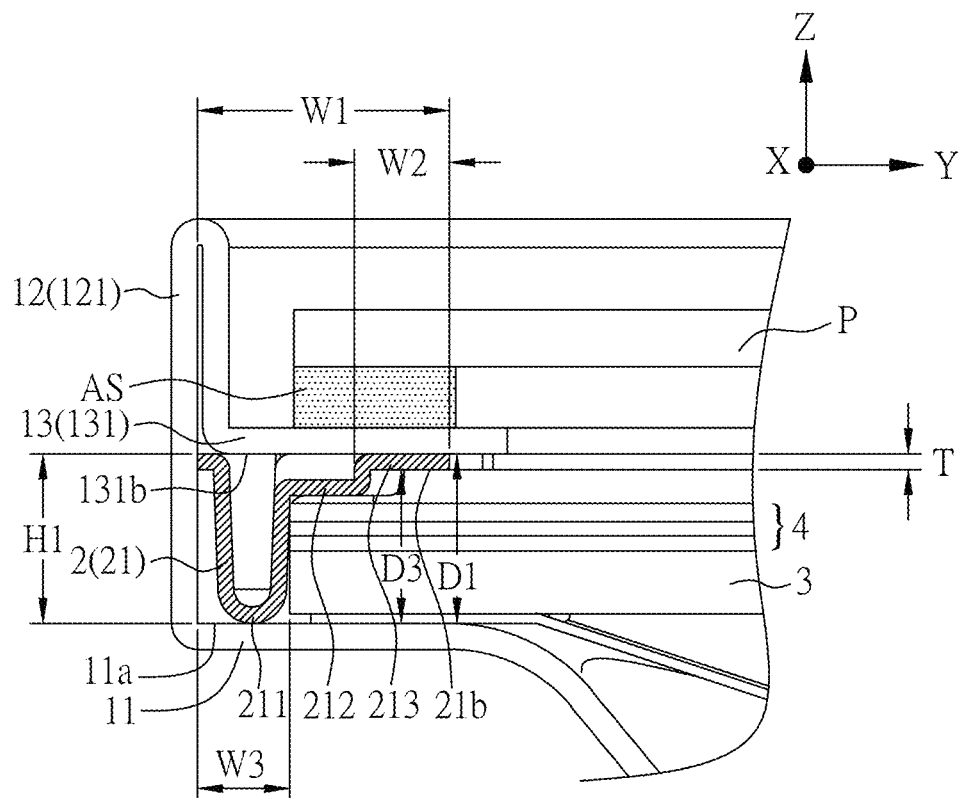
FIG. 3D is a schematic cross-sectional view of the electronic device of FIG. 3A taken along line segment C-C'.
Figure 3E:
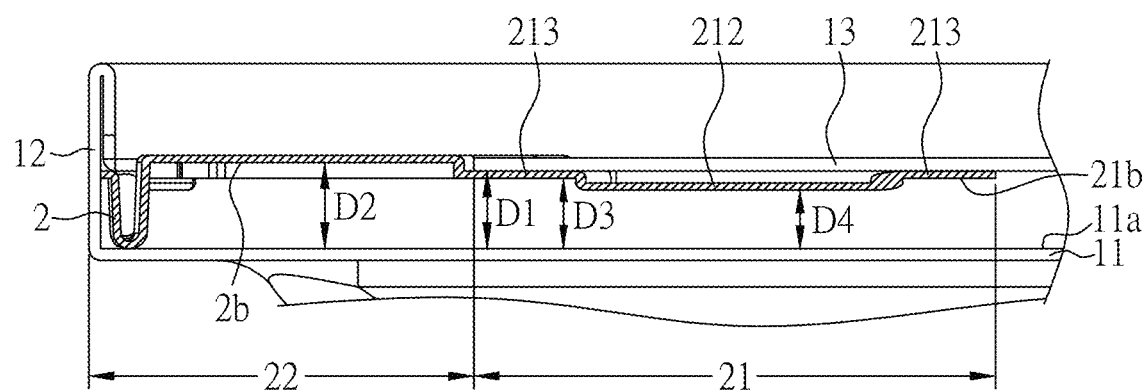
FIG. 3E is a schematic cross-sectional view of the electronic device of FIG. 3A taken along line D-D'.

FIG. 3A is an enlarged schematic diagram of the portion circled in FIG. 1A, FIG. 3B is a schematic three-dimensional view of a filling member according to an embodiment of the present disclosure, FIG. 3C is a schematic three-dimensional cross-sectional view of the electronic device of FIG. 3A taken along line C-C', FIG. 3D is a schematic cross-sectional view of the electronic device of FIG. 3A taken along line segment C-C', and FIG. 3E is a schematic cross-sectional view of the electronic device of FIG. 3A taken along line D-D', wherein, for convenience of explanation, some components are omitted in FIG. 3A and FIG. 3E.

In the present disclosure, as shown in FIG. 3A and FIG. 3B, the filling member 2 may include a first portion 21 and a second portion 22, wherein the first portion 21 and the second portion 22 are connected. In the normal direction Z of the panel P (as shown in FIGS. 3C and 3D), the first portion 21 overlaps with one of the at least two extension portions 13, and the second portion 22 does not overlap with the at least two extension portions 13. More specifically, the filling member 2 may include two first portions 21A, 21B and one second portion 22. The second portion 22 is disposed between the two first portions 21A, 21B and connected to the two first portions 21A, 21B respectively, wherein, in the normal direction Z of the panel P, the first portion 21A overlaps with the first extension portion 131, the first portion 21B overlaps with the second extension portion 132, and the second portion 22 does not overlap with the first extension portion 131 and the second extension portion 132. In FIG. 3B, the second portion 22 of the filling member 2 is represented by a dotted line, and the remaining portion is the first portion 21 of the filling member 2. By designing the filling member 2 to interfere with the extension portion 13 of the back plate 1, it is able to mitigate the defects such as light leakage of the electronic device.

In addition, in the present disclosure, as shown in FIG. 3A, one of the at least two extension portions 13 includes a first engaging structure S1 (or S1') at a location adjacent to the corner C of the back plate 1, and the second portion 22 of the filling member 2 includes a second engaging structure S2 (or S2') at one end adjacent to the first portion 21, wherein the first engaging structure S1 (or S1') and the second engaging structure S2 (or S2') are engaged with each other. More specifically, the first extension portion 131 includes a first engaging structure S1 at a location adjacent to the corner C of the back plate 1, and the second extension portion 132 includes a first engaging structure S1' at a location adjacent to the corner C of the back plate 1. The second portion 22 of the filling member 2 includes a second engaging structure S2 at one end adjacent to the first portion 21A (or at one end adjacent to the first extension portion 131). The second portion 22 of the filling member 2 include a second engaging structure S2' at one end adjacent to the first portion 21B (or at one end adjacent to the second extension portion 132), wherein the first engaging structure S1 and the second engaging structure S2' are engaged with each other, and the first engaging structure S1' and the second engaging structure S2' are engaged with each other. Through the design of the engaging structures, the filling member 2 may be fixed at the corner C of the back plate 1, and the filling member 2 and the extension portion 13 are engaged with each other, so as to improve the effect of blocking light leakage of the electronic device.

In one embodiment of the present disclosure, the first portion 21 of the filling member 2 is gradually expanded from the end E of the filling member 2 to the corner C of the back plate 1. More specifically, as shown in FIG. 3A, in the top view of the electronic device, the width of the first portion 21 of the filling member 2 gradually increases from the end E to the corner C of the back plate 1. For example, in the top view of the electronic device, the first portion 21A of the filling member 2 at a location adjacent to the end E has a width W in the second direction Y, and the first portion 21A of the filling member 2 at a location adjacent to the corner C of the back plate 1 has a width W' in the second direction Y, where the width W' is greater than the width W. In addition, since the first portion 21A and the first portion 21B may be symmetrically designed, the first portion 21B may have similar features, and thus a detailed description is deemed unnecessary. With the above design of the electronic device of the present disclosure, it is able to enhance the display quality by mitigating the shadow problem of the electronic device at the corner C.

In one embodiment of the present disclosure, as shown in FIG. 3B, the filling member 2 may include: a groove portion 211; a contact portion 213; and a connecting portion 212, wherein the connecting portion 212 is disposed between the groove portion 211 and the contact portion 213, and is connected to the groove portion 211 and the contact portion 213, respectively. More specifically, the first portion 21 of the filling member 2 may include: the groove portion 211, the contact portion 213 and the connecting portion 212, and the second portion 22 of the filling member 2 may include another groove portion 221, wherein the groove portion 211 is connected to another groove portion 221. Through the design of the connecting portion 212 and the contact portion 213, the stress on the filling member 2 may be dispersed. In addition, through the design of the groove portion 211 and another groove portion 221, the filling member 2 may have a better compressive elastic deformation amount.

In the present disclosure, as shown in FIG. 3D, the maximum distance between the bottom surface 11 of the back plate 1 and the first portion 21 of the filling member 2 is a third distance D3, wherein the first distance D1 may be greater than the third distance D3. The "third distance" refers to, for example, the maximum distance between the upper surface 11a of the bottom surface 11 parallel to the extension portion 13 and the lower surface 21b of the first portion 21 of the filling member 2 in the normal direction Z of the panel P. Alternatively, the "third distance" refers to, for example, the maximum distance between the upper surface 11a of the bottom surface 11 parallel to the extension portion 13 and the lower surface of the contact portion 213 of the filling member 2 in the normal direction Z of the panel P. The "first distance" refers to, for example, the maximum distance between the upper surface 11a of the bottom surface 11 parallel to the extension portion 13 and the lower surface 131b of the extension portion 13 in the normal direction Z of the panel P. In other words, in the normal direction Z of the panel P, the maximum distance between the upper surface 11a of the bottom surface 11 parallel to the extension portion 13 and the lower surface 131b of the extension part 13 of the back plate 1 is greater than that the maximum distance between the upper surface 11a of the bottom surface 11 parallel to the extension portion 13 and the lower surface 21b of the first portion 21 of the filling member 2.

In the present disclosure, as shown in FIG. 3E, the second distance D2 may be greater than the third distance D3. The "second distance" refers to, for example, the maximum distance between the upper surface 11a of the bottom surface 11 parallel to the extension portion 13 and the lower surface 2b of the filling member 2 in the normal direction Z of the panel P. More specifically, the second distance D2 refers to, for example, the maximum distance between the upper surface 11a of the bottom surface 11 parallel to the extension portion 13 and the lower surface 2b of the second portion 22 of the filling member 2. The "third distance" refers to, for example, the maximum distance between the upper surface 11a of the bottom surface 11 parallel to the extension portion 13 and the lower surface 21b of the first portion 21 of the filling member 2 in the normal direction Z of the panel P. Alternatively, the "third distance" refers to, for example, the maximum distance between the upper surface 11a of the bottom surface 11 parallel to the extension portion 13 and the lower surface of the contact portion 213 of the filling 2 in the normal direction Z of the panel P. In addition, the maximum distance between the bottom surface 11 of the back plate 1 and the connecting portion 212 of the filling member 2 is a fourth distance D4, wherein the third distance D3 is greater than the fourth distance D4. When the third distance D3 and the fourth distance D4 satisfy the above relationship, the filling member 2 may be made to disperse the stress. The "fourth distance" refers to, for example, the maximum distance between the upper surface 11a of the bottom surface 11 parallel to the extension portion 13 and the lower surface of the connecting portion 212 of the filling member 2 in the normal direction Z of the panel P.

In one embodiment of the present disclosure, in a cross-sectional view, as shown in FIG. 3D, the filling member 2 has a first width W1, the contact portion 213 has a second width W2, and the second width W2 accounts for 5% to 30% of the first width W1. More specifically, as shown in FIGS. 3C and 3D, the first portion 21 of the filling member 2 may include: a groove portion 211 in contact with the first side wall 121 of the back plate 1; a contact portion 213 in contact with the first extension portion 131 of the back plate 1; and a connecting portion 212 disposed between the groove portion 211 and the contact portion 213 and connected to the groove portion 211 and the contact portion 213, respectively, wherein the contact with the first extension portion 131 of the back plate 1 refers that the contact portion 213 of the filling 2 is in contact with the lower surface 131b of the first extension portion 131 of the back plate 1. In the cross-sectional view, the maximum width of the first portion 21 of the filling member 2 in the second direction Y is the first width W1. In more detail, the first width W1 of the first portion 21 of the filling member 2 is equivalent to the sum of the maximum widths of the groove portion 211, the connecting portion 212 and the contact portion 213 of the filling member 2 in the second direction Y, and the maximum width of the contact portion 213 of the filling member 2 in the second direction Y is the second width W2, wherein the second width W2 accounts for 5% to 30% of the first width W1. In one embodiment of the disclosure, the first width W1 may be between 1 mm and 30 mm, such as between 3 mm and 20 mm or between 3 mm and 10 mm, but the present disclosure is not limited thereto. When the relationship between the first width W1 and the second width W2 satisfies the above conditions, the first portion 21 of the filling member 2 may be made elastic to improve tightness between the first portion 21 of the filling member 2 and the extension portion 13 of the back plate 1 thereby reducing light leakage of electronic devices. In one embodiment of the present disclosure, the compressive elastic deformation amount of the first portion 21 of the filling member 2 may be between 1% and 10%, such as between 2% and 8% or between 3% and 6%, but the present disclosure is not limited thereto. With the compressive elastic deformation amount, when performing a compression deformation test on the filling member 2, a corresponding strain under a stress is obtained. When the ratio of the stress to the corresponding strain is a specific value, the filling member 2 2 is of elastic deformation. The compressive elastic deformation amount of the filling member 2 is defined as a strain value corresponding to the maximum compressive stress that can be withstood within the elastic deformation. In one embodiment of the disclosure, the thickness T of the filling member 2 may be greater than or equal to 0.1 mm and smaller than or equal to 0.7 mm, such as greater than or equal to 0.1 mm and smaller than or equal to 0.5 mm, but the present disclosure is not limited thereto. The "thickness of the filling member" refers to the thickness of the film material before the filling member 2 is processed. For example, as shown in FIG. 3D, the thickness T of the filling member 2 may be the difference between the first distance D1 and the third distance D3. Alternatively, it may be, for example, the thickness of the side wall of the groove portion, but the present disclosure is not limited thereto. When the relationship of the thickness T of the filling member 2 satisfies the above conditions, the filling member 2 may be made elastic.

In addition, in one embodiment of the present disclosure, as shown in FIG. 3D, the groove portion 211 may have a U-shape structure, that is, the groove portion 211 may have an arc-shape structure, but the present disclosure is not limited thereto. The ratio of the width W3 of the groove portion 211 to the height H1 of the groove portion 211 may be greater than or equal to 0.2 and smaller than or equal to 2, such as greater than or equal to 0.2 and smaller than or equal to 0.5, greater than or equal to 0.5 and smaller than or equal to 1, greater than or equal to 1 and smaller than or equal to 1.5, greater than or equal to 1.5 and smaller than or equal to 2. The "width of the groove portion" refers to, in a cross-sectional view (for example, FIG. 3D), the maximum width of the groove portion 211 of the filling member 2 in the second direction Y. The "height of the groove portion" refers to, in a cross-sectional view (for example, FIG. 3D), the maximum height of the groove portion 211 of the filling member 2 in the normal direction Z of the panel P. The height H1 of the groove portion 211 of the filling member 2 may be substantially equal to the first distance D1 between the bottom surface 11 of the back plate 1 and the extension portion 13.

The aforementioned specific embodiments should be construed as merely illustrative, and not limiting the rest of the present disclosure in any way.

The invention claimed is:

1. An electronic device, comprising:
 a back plate including a bottom surface, at least two side walls, at least two extension portions and at least one corner, wherein one of the at least two side walls is connected to the bottom surface and one of the at least two extension portions, part of the bottom surface and the at least two extension portions are parallel to each other, and the at least one corner is disposed between two adjacent extension portions;
 a filling member disposed at the corner of the back plate;
 an adhesive layer disposed on the filling member; and
 a panel disposed on the adhesive layer,
 wherein there is a first distance between the bottom surface and one of the at least two extension portions, a maximum distance between the bottom surface and the filling member is a second distance, and the second distance is greater than the first distance.

2. The electronic device as claimed in claim 1, wherein the filling member includes a first portion and a second portion, and the first portion is connected to the second portion, in which, in a normal direction of the panel, the first portion overlaps with one of the at least two extension portions, and the second portion does not overlap with the at least two extension portions.

3. The electronic device as claimed in claim 2, wherein a compressive elastic deformation amount of the first portion of the filling member is between 3% and 6%.

4. The electronic device as claimed in claim 2, wherein one of the at least two extension portions includes a first engaging structure adjacent to the corner, and the second portion of the filling member includes a second engaging structure at one end adjacent to the first portion, in which the first engaging structure and the second engaging structure are engaged with each other.

5. The electronic device as claimed in claim 2, wherein a maximum distance between the bottom surface and the first portion is a third distance, and a maximum distance between the bottom surface and the second portion is a second distance, in which the second distance is greater than the third distance.

6. The electronic device of claim 2, wherein the first part of the filling piece gradually expands from an end of the filling piece toward a corner of the back plate.

7. The electronic device as claimed in claim 1, wherein the filling member includes a groove portion, and the ratio of a width of the groove portion to a height of the groove portion is greater than 0.2 and smaller than or equal to 2.

8. The electronic device as claimed in claim 1, wherein the filling member includes:
 a groove portion in contact with one of the at least two side walls;
 a contact portion in contact with one of the at least two extension portions; and
 a connecting portion disposed between the groove portion and the contact portion, and connected to the groove portion and the contact portion, respectively,
 wherein, in a cross-sectional view, the filling member has a first width, the contact portion has a second width, and the second width accounts for 5% to 30% of the first width.

9. The electronic device as claimed in claim 8, wherein the first width is between 1 mm and 30 mm.

10. The electronic device as claimed in claim 1, wherein the filling member has a thickness greater than or equal to 0.1 mm and smaller than or equal to 0.7 mm.

11. The electronic device as claimed in claim 1, further comprising a light emitting unit, wherein the back plate further includes an inclined surface and a flat surface, the inclined surface is connected to the bottom surface and the flat surface, and the light emitting unit is disposed on the flat surface.

12. The electronic device as claimed in claim 1, wherein, in a normal direction of the panel, a maximum distance between an upper surface of the bottom surface and an upper surface of one of the at least two extension portions is equal to a maximum distance between the upper surface of the bottom surface and an upper surface of the filling member.

13. The electronic device as claimed in claim 1, further comprising a diffusion plate disposed on the back plate, and an optical film set disposed on the diffusion plate.

14. The electronic device as claimed in claim 5, wherein the first distance is greater than the third distance.

15. The electronic device of claim 5, wherein the filling member includes a groove portion, a contact portion, and a connecting portion disposed between the groove portion and the contact portion and connected to the groove portion and the contact portion respectively, and a maximum distance between a bottom surface of the back plate and the connecting portion of the filling member is a fourth distance, where the third distance is greater than the fourth distance.

16. The electronic device as claimed in claim 8, wherein the groove portion has a U-shape structure.

17. The electronic device as claimed in claim 2, wherein the filling member further includes another first portion, and the second portion is disposed between the first portion and the another first portion and connected to the first portion and the another first portion respectively, in which, in a normal direction of the panel, the another first portion overlaps with another one of the at least two extension portions.

18. The electronic device as claimed in claim 17, wherein a width of the first portion of the filling member gradually increases from an end of the first portion to the corner of the back plate.

19. The electronic device as claimed in claim 17, wherein a width of the another first portion of the filling member gradually increases from an end of the another first portion to the corner of the back plate.

20. The electronic device of claim 2, wherein the first portion of the filling member includes:
a groove portion, a contact portion, and a connecting portion disposed between the groove portion and the contact portion and connected to the groove portion and the contact portion respectively, and the second portion of the filling member includes another groove portion connected to the groove portion.

\* \* \* \* \*